Aug. 5, 1969 J. P. FOCARILE 3,459,998

MODULAR CIRCUIT ASSEMBLY

Filed Aug. 15, 1967 2 Sheets-Sheet 1

INVENTOR
J. P. FOCARILE
BY Leo [signature]
ATTORNEY

United States Patent Office 3,459,998

Patented Aug. 5, 1969

3,459,998

MODULAR CIRCUIT ASSEMBLY

Joseph P. Focarile, Freehold, N.J., assignor to Bell Telephone Laboratories, Incorporated, Murray Hill, N.J., a corporation of New York Filed Aug. 15, 1967, Ser. No. 660,756
Int. Cl. H02b *1/04*
U.S. Cl. 317—100 20 Claims

ABSTRACT OF THE DISCLOSURE

Integrated circuit chips are formed into convection-cooled integrated circuit assemblies having minimum lead distances and accessible circuit layers by arranging the chips on printed circuit boards whose central areas carry transversely-projecting connector prongs extending in both directions, and by stacking such boards with alternate blocks that space the boards from each other and connect the prongs of one board to another with tiltable hollow prong-engaging female buses passing through the blocks. Preferably two stacks of such boards are sandwiched between carrier boards that receive current from edge-connectors.

Background of the invention

This invention relates to circuit assemblies, particularly for interconnecting high-speed switching, or high-frequency operating, integrated circuits in modular fashion while exposing the modules to convection cooling, and making the modules accessible for alteration or replacement.

Integrated circuits are exceptionally suited for high-speed switching or high-frequency operating functions. However, interconnecting such circuits has posed a number of problems. For example, the leads required for electrically connecting circuits of a module and connecting modules to each other introduce reactances which may distort pulses and thus eliminate many advantages of integrated circuits for high-speed operation. Each foot of lead lines also delays pulses about one nanosecond.

In the past, some of these disadvantages of extensive lead lengths have been overcome by sandwiching the conductor patterns, which interconnect the integrated circuits, between insulating layers. This minimizes the lead lengths. Also, attempts have been made to overcome the excessive reactances by the introduction of compensating reactances. This is done for example with ground planes and strip lines.

However, the first of these expedients rendered the conductors substantially inaccessible for repair. Thus the assembly is not truly modular. It is not amenable to removal of one section for change and repair. Also sandwiching of the layers prevents simple cooling.

The use of strip lines and ground planes requires extra effort to calculate inductances and capacitances. Moreover, it fails to correct propagation delays introduced by long leads.

The invention

According to the invention, the disadvantages of such integrated-circuit assemblies are obviated by concentrating contact means not at the edges but at an interior region of our surfaces of spaced parallel boards having printed circuitry that connects integrated circuits on the boards to each other and to the contact means, and by removably connecting the contact means on the interior surface of one of the boards to the contact means on the interior of an adjacent board with connector blocks that space the boards from each other so that air circulates between the spaced boards. Preferably, the respective connector means include a block of insulating material smaller but thicker than the boards for spacing the boards, and conductive portions passing transversely through the material for contacting the contacting means.

According to another feature of the invention the contact means are located at the center of each board. Preferably the contact means constitute a plurality of prongs extending transversely in both directions from the center of the board and connected to printed wiring on the board, and the connector means comprise a plurality of female jacks or sockets mounted in cavities within a block of insulating material and free to move within limits in any direction, so as easily to connect prongs on one board with prongs on an adjacent board. The engaged prongs and sockets thus constitute fixed-length buses between the boards. By being on an interior region of the board's surface, such as in the center, the buses reduce the maximum distance between an integrated circuit on the edge of one board to an integrated circuit near the edge of an adjacent board to one card diameter plus one bus length.

Preferably the integrated circuits are mounted on the boards by bonding them, in the form of chips, on substrates that have radial conductor paths welded to substantially microscopic beam leads that emerge from the chips and by laying the substrates on the boards so the conductor paths can be bonded to lands on the printed circuit board.

According to another feature of the invention two or more stacks of such boards connect to contact means on two or more interior locations on end boards sandwiching the stacks of boards between them.

By virtue of these features an extensive integrated system can be interconnected modularly with minimum lead lengths while exposing the integrated circuits to convection cooling and allowing repair and change. Such an assembly can still incorporate ground planes or strip lines if necessary. Moreover, such structures are compatible with discrete component technology.

The above and other features of the invention are pointed out in the claims. Other objects and advantages of the invention will become better understood from the following detailed description when read in light of the accompanying drawings.

Description of preferred embodiment

Figure 1:
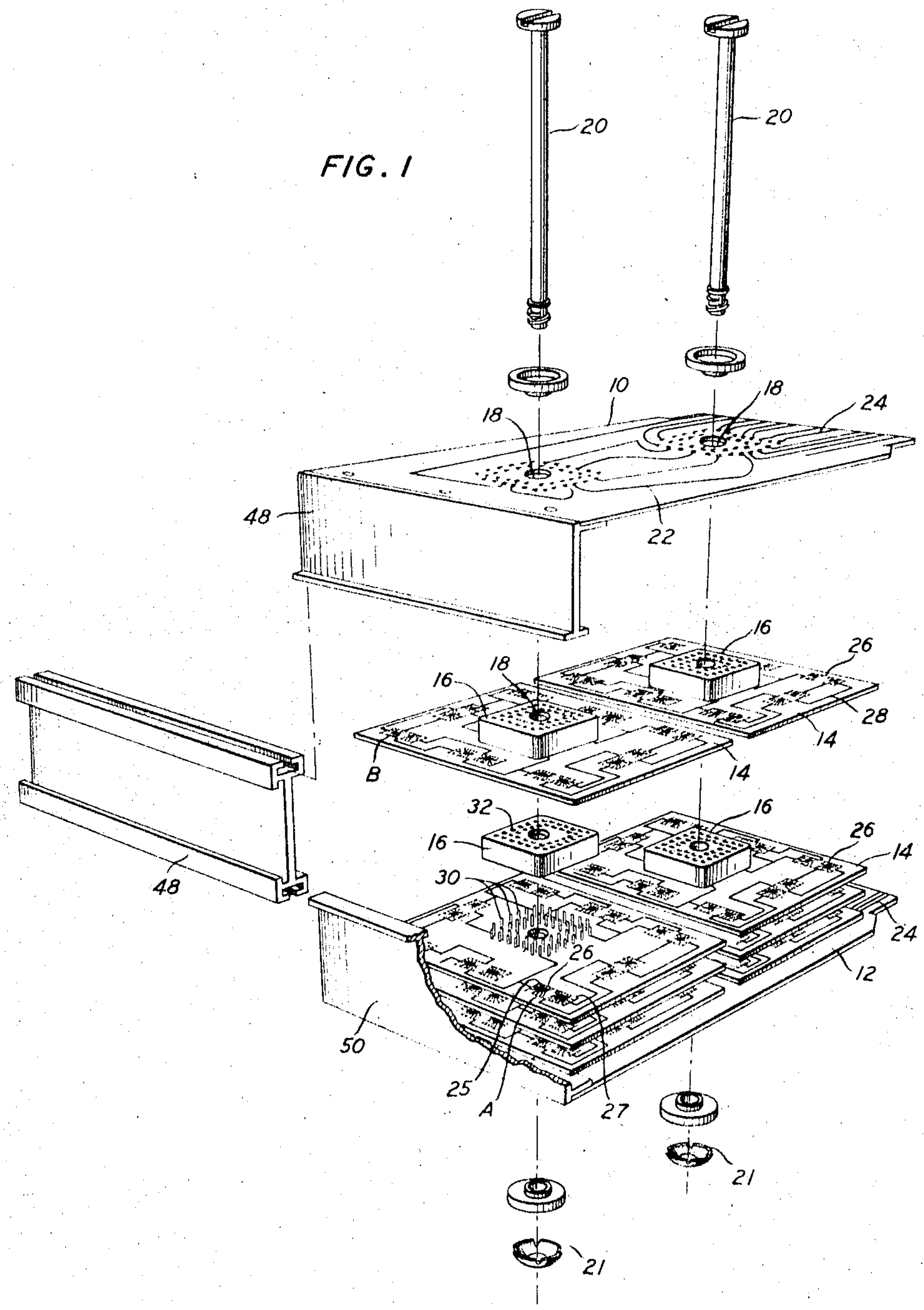
FIG. 1 is a partly exploded perspective view illustrating an assembly embodying features of the invention.

In FIG. 1 two printed circuit end boards 10 and 12 sandwich between them two side-by-side stacks of integrated circuit boards 14 alternating with respective female-female connectors 16 located at the centers of the cards in each stack. The connectors 16 are smaller than the cards 14 in width and length but greater than the boards in thickness. Passing through suitable openings 18 in the boards 10, the connectors 16, and the boards 14 are two bolts 20 that connect with nuts 21 for holding the assembly together.

The end boards 10 carry printed circuitry 22 terminating at one edge of each board in connector fingers or lands 24. Integrated circuit chips 25 are secured to the surface of ceramic or epoxy glass substrates 26 and connected to radially extending vacuum-deposited or etched leads 27 on the substrates by ultrasonic welding. The substrates are mounted on the boards 14. The radial leads 27 at the edges of substrate 26 are connected to printed circuitry 28 on the cards by soldering.

The substrates 26 are sometimes called daughter-boards in contradistinction to the boards 14 that are sometimes known as mother-boards. However, here the term board refers specifically to the mother-boards, i.e., boards 14. The end boards 22 are sometimes known as grandmother-boards.

Projecting transversely, both up and down, from the surfaces at the center of each board 14 are a number of prongs 30 that mate with female sockets or tubes 32 in the connectors 16. The printed circuit wiring 28 connects suitable ones of the prongs 30 to the correct integrated circuit leads 27 and chips 25. This then connects the substrates 26 and chips 25. The substrates 26 and chips 25 on one board are then connected with the substrates 26 and chips 25 on other boards 14 through the buses established by the prongs 30 and female sockets 32.

Figure 2:
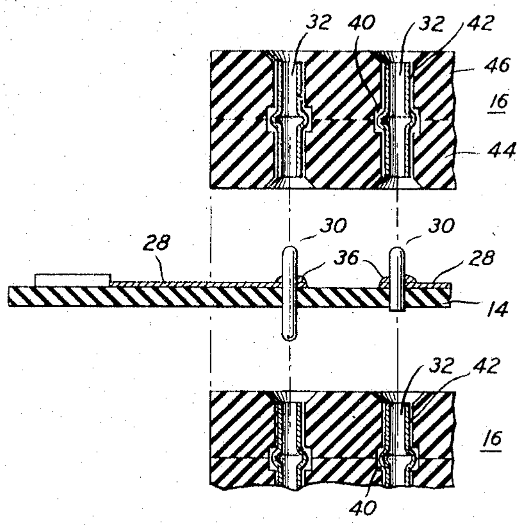
FIG. 2 is an exploded cross-sectional view of the connector and contact details in FIG. 1.
Figure 3:
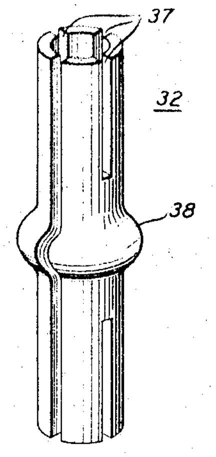
FIG. 3 is a detailed perspective view of a tube in FIGS. 1 and 2.
Figure 4:
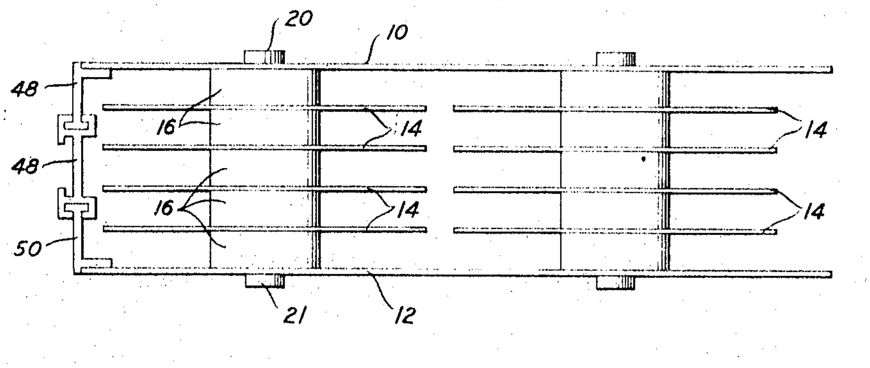
FIG. 4 is a cross-sectional view of an assembly similar to FIG. 1 and embodying features of the invention.

The details of the prongs 30, tubes 32 and female connector 16 appear in the exploded cross-sectional detailed view of FIG. 2 and in the perspective view of FIG. 3. In FIG. 2 only two of the many prongs 30 and tubes 32 in the center of the boards 14 and the female connector 16 appear. This is done only for clarity although it will be understood that they represent the operation of the entire female-male connector arrangement with its many more prongs 30 and tubes 32. The prongs 30 are rigidly secured in openings in the board 14 by solder joints 36 between the prongs 30 and the printed wiring 28. They project rigidly into the tubes 32 whose appearance is shown in detail in FIG. 3.

The tubes 32 are composed of flexible and resilient metallic conductive material split longitudinally to furnish a degree of radial resilience. Additional slits 37 are cut from each end for extra radial resilience. However these are added only where necessary. A peripheral bump 38, manufactured in the tubes 32 prior to their being rolled up into tubular shape fit into annular grooves 40 in the connector 16. The connector 16 is formed from two halves which are molded identically to form bores 42, annular grooves 40 at the inner interfaces 44, and conical countersinks at the outer faces 46. The latter furnish easy access for the prongs 30. The halves are then secured together with the tubes 32 placed so that the bumps 38 lie in the grooves 40. The latter allow only limited longitudinal and radial movement of the tubes 32. However, the dimensions of the bores 42 which are radially smaller than the peripheral bumps 38 are nevertheless wide enough to provide for tilting and radial movement of the tubes 32. The tubes 32 thus float in the connector 16. Thus, prongs 30 entering at slightly wrong directions or at slightly misplaced locations allow the tubes 32 to tilt about the bumps 38 and thereby mate with them. This allows for batch-fabrication with comparatively broad tolerances.

The material of which the tube 32 is made is such as also to provide beam flexure so that prongs approaching at odd angles from both sides of the connector permit the tube 32 to bend slightly and accommodate itself to the location of the prongs. For convenience, prongs can be interconnected, completely omitted, or snipped off, to provide the type of connection desired in FIG. 1. One of the prongs 30 in FIG. 2 appears as being snipped off on its lower end so as not to make contact with the lower tube 32.

By providing a sufficient number of tubes 32 in the connector 16 and a sufficient number of prongs 30 in the boards 14, any number of connections may be established. Preferably the number of prongs and tubes is sufficient so that a portion of them can be dispensed with and connections started and stopped between boards 14 as necessary.

Instead of the boards being manufactured with the contact area only in the center, boards may be manufactured otherwise. For example on the boards 10 contact areas are distributed at critical locations away from the edges of the board to furnish minimum contact distances between integrated circuit chips. In FIG. 1 the outer upstanding prongs on the upper board 10 are omitted. The rigidly secured prongs assure reliable connection with the printed circuitry 28. At the same time the floating tubes 32 assure consistent contact with the rigid prongs.

The lengths of the prongs are great enough to enter the tubes 32. However, they are made short enough to minimize the degree of entrance into the socket. This achieves a number of advantages. It minimizes the bending moment which forces upon the prong apply to the prong. Thus, the prong is less susceptible to damage. Moreover, by entering the tube 32 only slightly it permits greater angular moment of the tube relative to the prong than would otherwise be possible. This allows for wide tolerances in manufacture.

The boards 14 are manufactured from larger sheets and cut as necessary. The prongs 30 are applied either before or after cutting using batch-fabrication techniques. For example, the manufacturing may be accomplished by etching or depositing the printing that represents each one of the boards 14 in the assembly. The manufacturing can proceed by cutting each one of the sheets, applying the preassembled prongs and substrates and then assembling the entire structure with connectors 16. Mechanical assembly is completed by engaging the nuts 22 with the bolts 20. For convenience in handling and placing in a system, extruded aluminum flanged assembly members 48 and 50 are secured to the end boards 10 and 12 and slidably connected to each other. Thus, a firm structure capable of being plugged in at the lands 24 is easily furnished with minimum lead lines. These members 48 and 50 are also used to carry identification strips.

The lengths of the tubes 32 and the prongs 30 by being substantially uniform assure that the batch-fabrication does not introduce extra lengths which might otherwise disturb high-frequency operation. For example, wires passing from point A at one of the boards 14 to the point B on another of the boards 14 need to pass only half the diagonal length of one of the boards, the length of the prongs 30 and tubes 32, and half the diagonal length of the other board 14. These lengths are substantially consistent even when the assembly is manufactured with high tolerances.

The boards 14 may also carry discrete component devices alone, or together with the chips. As such this system is compatible with discrete component technology. The batch-fabrication techniques are further enhanced by securing each of the prongs 30 firmly on the board 14 and requiring no floating contact as would be necessary if female contacts were on the board.

While embodiments of the invention have been described in detail, it will be obvious to those skilled in the art that the invention may be practiced otherwise without departing from its spirit and scope.

What is claimed is:

1. A printed circuit assembly comprising a plurality of spaced parallel boards having printed circuitry, contact means projecting transverse to each board from an interior region of a surface of each board and connected to said printed circuitry, connector means matable with said contact means so as to remain entirely within the edges of said boards for removably connecting said contact means on the interior surface of one of said boards to the contact means on the interior surface of an adjacent board and for spacing said boards from each other when said connector means and said contact means mate so that air circulates between said spaced boards.

2. An assembly as in claim 1 wherein said contact means are located at the center of each board.

3. An assembly as in claim 1 wherein securing means pass through the centers of said contact means and through said connector means for holding said boards and connector means together and in fixed spaced relation.

4. An assembly as in claim 1 wherein said connector means comprise a block of insulating material smaller than said board in width and length for spacing said boards and conductive portions passing transversely through said material for contacting said contact means.

5. An assembly as in claim 1 wherein said connector means comprise a block smaller than said boards in width and length but thicker than said boards.

6. An assembly as in claim 1 wherein a plurality of connector means alternate and mate with a plurality of contact means on said plurality of boards.

7. An assembly as in claim 1 wherein said printed circuitry connects to an integrated circuit on each board.

8. An assembly as in claim 1 where said contact means include male prongs transversely projecting from said boards and fixed relative to said boards.

9. An assembly as in claim 1 wherein said contact means include male prongs projecting transversely from each face of one of said boards and fixed relative to said one of said boards.

10. An assembly as in claim 1 wherein said connector means include an insulating block and open tube-like female members movably mounted to extend through said block for mating with the connector means on adjacent ones of said boards.

11. An assembly as in claim 1 wherein said contact means include male prongs transversely projecting from said boards and fixed relative to said boards and wherein said connector means include an insulating block and open tube-like female members movably mounted to extend through said block for mating with said prongs and adjacent boards.

12. An assembly as in claim 1 wherein said contact means include male prongs projecting transversely from each face of one of said boards and fixed relative to said one of said boards and wherein said connector means include an insulating block and open tube-like female members movably mounted to extend through said block for making contact with the prongs on adjacent ones of said boards.

13. An assembly as in claim 1 wherein one of said boards has edge connector means at one end of said board for contacting a jack.

14. An assembly as in claim 12 wherein a plurality of said boards and a plurality of said connectors form a stack.

15. An assembly as in claim 1 wherein two pluralities of said boards are alternately stacked with connector means and said connector means connect the contact means of one of said boards to the contact means on the adjacent one of said boards, and wherein connector means mating with exterior contact means on the top and bottom ones of said boards in each plurality connect said boards to respective contact means located on top and bottom end boards each having circuitry and extending across both stacks of boards and plug means on the edge of one of said end boards for connecting said printed circuitry to an edge connector.

16. An assembly as in claim 15 wherein said contact means include male prongs transversely projecting from said boards and fixed relative to said boards and wherein said connector means include an insulating block and open tube-like female members movably mounted to extend through said block for mating with said prongs on adjacent boards.

17. An assembly as in claim 15 wherein said contact means include male prongs projecting transversely from each face of one of said boards and fixed relative to said one of said boards, and wherein said connector means include an insulating block and open tube-like female members mounted to move over a limited range in all directions and to extend through said block for mating with said prongs on adjacent ones of said boards.

18. An assembly as in claim 15 wherein securing means pass through the centers of said contact means and said connector means for holding said boards and connector means together and in fixed spaced relation.

19. An assembly as in claim 15 wherein securing means pass through the centers of said contact means and said connector means in each of said plurality of said boards and connectors for holding said boards and connector means together and in fixed spaced relation.

20. An assembly as in claim 15 wherein hardware means hold the edges of said end boards to form a single modular unit.

References Cited

UNITED STATES PATENTS

| | | | |
|---|---|---|---|
| 2,947,914 | 8/1960 | Simons | 317—101 |
| 2,954,542 | 9/1960 | Wales. | |
| 3,124,720 | 3/1964 | Green. | |

LEWIS H. MYERS, Primary Examiner

D. A. TONE, Assistant Examiner

U.S. Cl. X.R.

317—99